/ United States Patent (12)
Lee et al.

(10) Patent No.: US 6,856,003 B2
(45) Date of Patent: Feb. 15, 2005

(54) MICROELECTRONIC 3-D SOLENOID OF CIRCULAR CROSS-SECTION AND METHOD FOR FABRICATION

(75) Inventors: Hsin-Li Lee, Hsinchu (TW); Cheng-Hong Lee, Shinjuang (TW); Yi-Shiau Chen, Yunlin (TW)

(73) Assignee: Industrial Technology Research Institute, Hsinchu (TW)

( * ) Notice: Subject to any disclaimer, the term of this patent is extended or adjusted under 35 U.S.C. 154(b) by 233 days.

(21) Appl. No.: 10/236,271

(22) Filed: Sep. 5, 2002

(65) Prior Publication Data

US 2004/0046232 A1 Mar. 11, 2004

(51) Int. Cl.[7] .......................... H01L 21/00; H01L 27/04; H01L 29/00
(52) U.S. Cl. ........................................ 257/531; 257/530
(58) Field of Search ................................. 257/528, 531

(56) References Cited

U.S. PATENT DOCUMENTS 5,336,921 A * 8/1994 Sundaram et al. .......... 257/531
6,433,665 B2 * 8/2002 Huang et al. ............... 336/200
6,459,352 B1 * 10/2002 Liu et al. .................... 336/200
6,677,659 B2 * 1/2004 Yen et al. .................... 257/531
2002/0100161 A1 * 8/2002 Ahn et al. ...................... 29/604
2004/0004266 A1 * 1/2004 Furumiya et al. ........... 257/528

* cited by examiner

Primary Examiner—Tom Thomas
Assistant Examiner—Jesse A. Fenty
(74) Attorney, Agent, or Firm—Shaw Pittman LLP

(57) ABSTRACT

A microelectronic 3-dimensional solenoid of substantially circular or oval cross-section and a method for fabricating the solenoid. The solenoid is provided including a pre-processed semiconductor substrate, two supports upstanding from and spaced-apart on a top surface of the substrate, each support has a bottom end attached to the substrate. An inductor coil which has two spaced-apart ends each attached to one of two top ends of the two supports. The inductor coil is formed of a bi-layer metal laminate that has an inner metal layer and an outer metal layer. The outer metal layer is formed of a first metal that has a coefficient of thermal expansion larger than a coefficient of thermal expansion of a second metal that forms the inner metal layer.

10 Claims, 3 Drawing Sheets

MICROELECTRONIC 3-D SOLENOID OF CIRCULAR CROSS-SECTION AND METHOD FOR FABRICATION

FIELD OF THE INVENTION

The present invention generally relates to a microelectronic 3-dimensional solenoid formed on a semiconductor substrate and a method for fabrication, and more particularly, relates to a microelectronic 3-dimensional solenoid that has a generally circular cross-section formed on a semiconductor substrate and a method for such fabrication.

BACKGROUND OF THE INVENTION

Miniaturization of motors, actuators and similar machine parts is receiving increasing attention because of the new uses of these devices made possible because of their small size. Additionally, these devices can be manufactured in large quantities at low piece-part cost. Current designs of miniaturized machine parts can be categorized according to size or scale. Macroscopic machine parts have a length in the range of approximately 1 to 10 inches, and while microscopic machine parts, sometimes referred to as MEMS (Micro-Electro-Mechanical-System) have a length in the range of 0.01 to 1 inch.

In any event, existing miniaturized actuators and motors of both macroscopic of microscopic size are essentially replicas of larger motors, and thus include such component parts as windings, stators, gears, transmission links, etc. These miniaturized parts must be assembled with high precision in order to produce an operable device providing the desired function, e.g. movement of an electrically activated component that then mechanically engages other parts to induce motion. Depending upon the engagement configuration, this motion may be linear in any of several axes, rotary, circular, etc. Because of the number of complex parts that must be assembled with a high degree of precision, the yields of parts meeting target specifications and performance are relatively low using current manufacturing processes. These low yields in turn increase the cost of the parts. Accordingly, it would be desirable to provide a new form of actuator and related method for inducing movement of an object on a microscopic or macroscopic scale which eliminates the problems mentioned above.

The MEMS technology has recently been extended to the semiconductor fabrication industry. In the present state of the art, a semiconductor device is normally formed in a planar structure and therefore the process for fabricating the semiconductor device is generally a planar process. For instance, layers of different materials, i.e. such as insulating materials and metallic conducting materials, are deposited on top of one another and then features of the device are etched through the various layers. The planar fabrication process, while adequate in fabricating most semiconductor elements and devices, is not suitable for fabricating certain devices that are 3-dimensional in nature. For instance, a 3-D solenoid, i.e. or a 3-D inductor coil, must be fabricated by stacking a large number of layers from the bottom to the top and therefore, requires a large number of photomasks to complete the task. For instance, when CMOS technology is used in forming such 3-D solenoid, at least four other steps utilizing photomasks must be incorporated in order to complete the fabrication process. Moreover, the precise alignment between the layers is necessary in order to avoid a variety of processing difficulties occurring at the interfaces.

Another limitation imposed by the planar processing technology is that only a square or rectangular-shaped 3-D solenoid can be fabricated. A 3-D solenoid of circular shape cannot be fabricated by such technology. In order to raise a 3-D solenoid from a semiconductor substrate, very thick photoresist layers and electroplating techniques for filling large aspect ratio structures must also be utilized, which further increases the complexity of the fabrication process.

3-D solenoids or inductor coils have been widely used in radial frequency (RF) communication technologies. It is especially critical for RF passive telecommunication devices which require high quality factor inductors. For instance, such high quality factor inductors include those utilized in RF filters or RF oscillators. Presently, RF telecommunication devices utilize inductor coils that are planar inductor coils which produces a magnetic field that is perpendicular to the device substrate. As a result, induced currents are produced in a silicon substrate, thus causing significant energy loss, and consequently, leading to a low quality factor. This drawback prevents the use of such devices at even higher radio frequencies. For instance, presently fabricated components for telecommunication equipment such as passive elements of inductor coils, capacitors and resistors cannot be fabricated on the same silicon substrate with the active elements. Instead, such passive elements are assembled together with the active elements on a circuit board producing a circuit board of very large area to accommodate the passive elements. If the passive elements can be combined with the active elements on the same semiconductor substrate, the size of the communication module can be significantly reduced.

It is therefore an object of the present invention to provide a method for fabricating a microelectronic 3-D solenoid that does not have the drawbacks or shortcomings of the conventional methods for fabrication.

It is another object of the present invention to provide a microelectronic 3-D solenoid which can be fabricated by a MEMS technology.

It is a further object of the present invention to provide a microelectronic 3-D solenoid that can be fabricated on a semiconductor substrate by CMOS technology.

It is another further object of the present invention to provide a microelectronic 3-D solenoid fabricated by MEMS technology such that the solenoid can be self-assembled without the need of any additional actuation or monitoring.

It is still another object of the present invention to provide a method for fabricating a microelectronic 3-D solenoid by a CMOS technology on a silicon substrate and then releasing the planar structure of the inductor coil from the substrate forming the 3-D structure.

It is yet another object of the present invention to provide a method for fabricating a microelectronic 3-D solenoid having an inductor coil formed of a bi-layer metal structure laminated together by two metal layers having different coefficients of thermal expansion.

SUMMARY OF THE INVENTION

In accordance with the present invention, a method for fabricating a microelectronic 3-dimensional solenoid and the solenoid device fabricated are disclosed.

In a preferred embodiment, a microelectronic three-dimensional solenoid is provided which includes a pre-processed semiconductor substrate; two supports upstanding from and spaced-apart on a top surface of the pre-processed semiconductor substrate, each support has a bottom end attached to the top surface of the substrate; an inductor coil having two spaced-apart ends each attached to one of two top ends of the two supports, the inductor coil is formed of a bi-layer metal laminate having an inner metal layer and an outer metal layer, the outer metal layer is formed of a first metal that has a coefficient of thermal expansion larger than a coefficient of thermal expansion of a second metal that forms the inner metal layer.

The microelectronic 3-dimensional solenoid may further include conductive pads in the pre-processed semiconductor substrate for contacting the bottom ends of the supports. The outer metal layer may have a thickness between about 0.5 $\mu$m and about 2 $\mu$m, the inner metal layer may have a thickness between about 0.1 $\mu$m and about 0.5 $\mu$m. The first metal may be selected from the group consisting of Al, Cu and AlCu alloys, the second metal may be is Ni or Cr. The two supports may be formed of a metal selected from the group consisting of Al, Cu and AlCu alloys. The pre-processed semiconductor substrate may be a silicon substrate. The two supports have a height sufficient to allow the inductor coil to be suspended over the pre-processed semiconductor substrate. The outer metal layer may have a thickness of about 1 $\mu$m and the inner metal layer may have a thickness of about 0.2 $\mu$m. The inductor coil may have a substantially circular cross-section, or may have a substantially oval cross-section.

The present invention is further directed to a method for fabricating a microelectronic 3-dimensional solenoid which can be carried out by the operating steps of first providing a pre-processed semiconductor substrate that has a conductive pad in a top surface; depositing a first sacrificial layer on the top surface of the pre-processed semiconductor substrate; patterning and etching a first opening in the first sacrificial layer exposing the conductive pad; depositing a first metal into the opening and covering the sacrificial layer forming a first metal layer; depositing a second metal on top of the first metal layer forming a second metal layer; the second metal has a coefficient of thermal expansion smaller than a coefficient of thermal expansion of the first metal; depositing a second sacrificial layer on top of the second metal layer; depositing the second metal on top of the second sacrificial layer forming a third metal layer; patterning and etching a second opening at one end of the pre-processed semiconductor substrate; depositing the first metal into the second opening forming a hinge and on top of the third metal layer forming a fourth metal layer; removing the first and second sacrificial layers by an etching process and releasing the third metal layer from the second metal layer to allow the formation of a substantially circular or oval inductor coil.

The method for fabricating a microelectronic 3-dimensional solenoid may further include the step of depositing the first and second sacrificial layers of a material selected from the group consisting of silicon oxide, silicon oxynitride and silicon nitride. The method may further include the step of providing the pre-processed semiconductor substrate in a silicon substrate with an aluminum conductive pad formed in a top surface. The method may further include the step of selecting the first metal from the group consisting of Cr or Ni. The method may further include the step of selecting the second metal from the group consisting of Al, Cu and AlCu alloys. The method may further include the step of, after depositing the first metal layer, planarizing a top surface of the first metal layer. The method may further include the step of forming the fourth metal layer by an electroplating process. The method may further include the step of removing the first and second sacrificial layers by a wet etching technique. The method may further include the step of depositing the first and fourth metal layers to a thickness between about 0.5 $\mu$m and about 2 $\mu$m, or the step of depositing the second and third metal layers to a thickness between about 0.1 $\mu$m and about 0.5 $\mu$m.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a microelectronic 3-dimensional solenoid and a method for fabricating the solenoid. The 3-dimensional solenoid may have a substantially circular cross-section, or may have a substantially oval cross-section.

The microelectronic 3-dimensional solenoid is built on a pre-processed semiconductor substrate with two supports upstanding from and spaced-apart on a top surface of the pre-processed semiconductor substrate. Each support has a top end for connecting to an inductor coil and a bottom end for attaching to the top surface of the substrate. An inductor coil that has two spaced-apart ends each attached to one of the two top ends of the two supports. The inductor coil is formed of a bi-layer metal laminate that has an inner metal layer and an outer metal layer. The outer metal layer may be formed of a first metal that has a coefficient of thermal expansion larger than a coefficient of thermal expansion of a second metal that forms the inner metal layer.

The outer metal layer in the inductor coil may have a thickness between about 0.5 μm and about 2 μm, and preferably between about 0.8 μm and about 1.2 μm. The word "about" used in this writing indicates a range of values that is ±10% of the average value given. The inner metal layer of the inductor coil may have a thickness between about 0.1 μm and about 0.5 μm, and preferably between about 0.15 μm and about 0.3 μm.

Figure 1A:
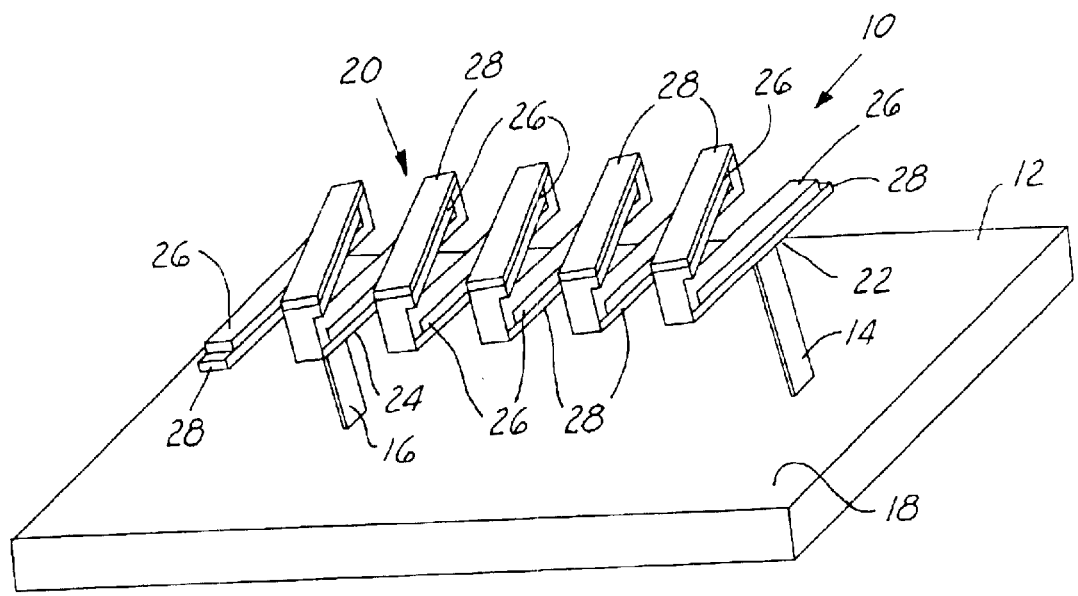
FIG. 1A is a perspective view of the present invention microelectronic 3-dimensional solenoid structure before released from the semiconductor substrate.

Referring initially to FIG. 1A, wherein a present invention microelectronic 3-dimensional solenoid 10 is shown supported on a semiconductor substrate 12. The solenoid 10 is constructed by two supports 14,16 upstanding from and spaced-apart on a top surface 18 of the pre-processed semiconductor substrate 12. Each of the two supports 14,16 have a bottom end attached to the top surface 18 of the substrate 12. An inductor coil 20 that has two spaced-apart ends 22,24 each attached to one of the two top ends of the two supports 14,16. The inductor coil 20 is formed of a bi-layer metal laminate that has an inner metal layer 26 and an outer metal layer 28. The outer metal layer 28 is formed of a first metal such as Al, Cu or AlCu alloys that have a coefficient of thermal expansion larger than a coefficient of thermal expansion of a second metal used in forming the inner metal layer 26. The second metal may be advantageously Ni or Cr.

Figure 1B:
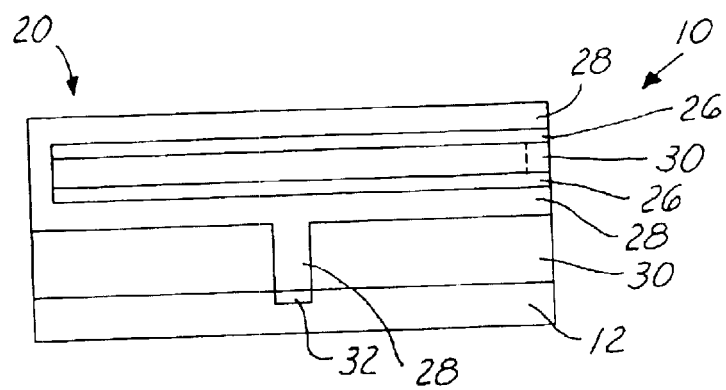
FIG. 1B is an enlarged, cross-sectional view of the present invention microelectronic 3-dimensional solenoid before released from the semiconductor substrate.

FIG. 1B is an enlarged, cross-sectional view of the present invention microelectronic 3-dimensional solenoid 10 with the inductor coil 20 embedded in the semiconductor substrate 12. It should be noted that, while the inductor coil 20 shown in FIG. 1A is similarly embedded, the sacrificial layer 30 (shown in FIG. 1B) that embeds the inductor coil 20 is not shown in FIG. 1A. The sacrificial layer may be advantageously formed of a dielectric material or a metal material that can be easily etched away in a wet etch or dry etch process. For instance, a convenient dielectric material is silicon oxide, silicon oxynitride or silicon nitride. The conductive pad 32, which is formed of a conductive metallic material such as aluminum or aluminum alloys, is embedded in the top surface of the silicon substrate 12 to provide electrical connection to the inductor coil 20. Again, it should be emphasized that the structure of the microelectronic 3-dimensional solenoid shown in FIGS. 1A and 1B is in a non-released state before the inductor coil is made functional.

A suitable thickness for the outer metal layer 28, which is formed of Al, Cu or AlCu alloys, may be between about 0.5 μm and about 2 μm, and preferably between about 0.8 μm and about 1.5 μm. The inner metal layer 26 may be suitably formed of Ni or Cr, having a thickness between about 0.1 μm and about 0.5 μm, or preferably between about 0.15 μm and about 0.3 μm.

Figure 2A:
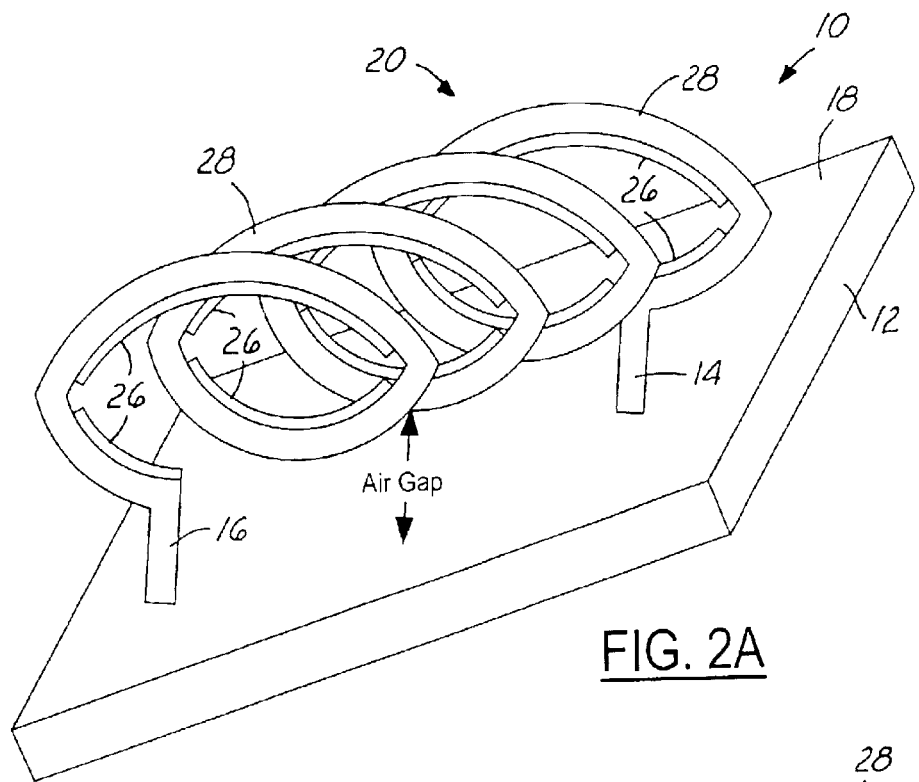
FIG. 2A is a perspective view of the present invention microelectronic 3-dimensional solenoid after released from the semiconductor substrate.
Figure 2B:
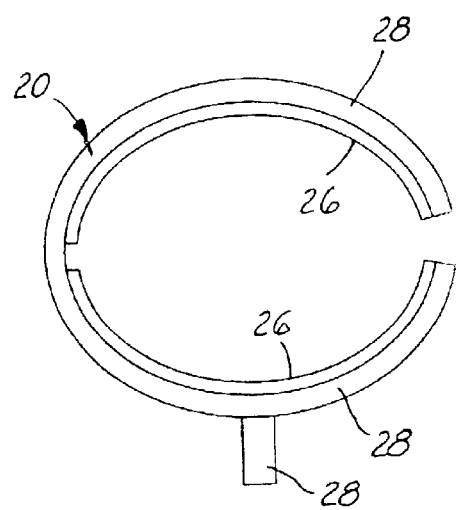
FIG. 2B is an enlarged, cross-sectional view of the present invention microelectronic 3-dimensional solenoid after released from the semiconductor substrate.

The present invention microelectronic 3-dimensional solenoid in a functional form is shown in FIGS. 2A and 2B.

After the sacrificial layers 30 are removed by an etching technique, either by wet or by reactive ion dry etching, the 3-dimensional inductor coil 20 is released and expands into the shape shown in FIGS. 2A and 2B. The expansion of the inductor coil 20 into either a substantially circular shape, or a substantially oval shape, is caused by the difference in thermal expansion coefficient in the materials that are used for forming the outer metal layer 28 and the inner metal layer 26. For instance, the metal material of Al, Cu or AlCu alloys used in forming the outer metal layer 28 has a coefficient of thermal expansion larger than the coefficient of thermal expansion of Ni or Cr used in forming the inner metal layer 26.

The present invention further discloses a method for fabricating a microelectronic 3-dimensional solenoid that can be carried out by the operating steps of first providing a pre-processed semiconductor substrate that has a conductive pad, i.e. such as an aluminum bond pad formed in a top surface. A first sacrificial layer such as silicon oxide is then deposited on top of the pre-processed semiconductor substrate. A first opening in the first sacrificial layer is then patterned and etched to expose the conductive pad. After a first metal is deposited into the opening and covering the sacrificial layer to form a first metal layer, a second metal is deposited on top of the first metal layer to form a second metal layer. The second metal of Ni or Cr has a coefficient of thermal expansion smaller than a coefficient of thermal expansion of the first metal which may be Al, Cu or AlCu alloys. A second sacrificial layer which may be formed of silicon oxide, silicon oxynitride or silicon nitride is deposited on top of the second metal layer. A third metal layer is then deposited on top of the second sacrificial layer by using the same second metal material, followed by a patterning and etching process to form a second opening at one end of the pre-processed semiconductor substrate. A first metal is then deposited into the second opening to form a hinge portion and on top of the third metal layer forming a fourth metal layer. In the final step, the first and the second sacrificial layers are removed by an etching process to release the second metal layer from the third metal layer and to allow the formation of a substantially circular or oval inductor coil.

Figure 3A:
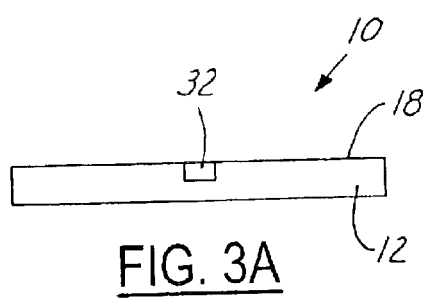
FIG. 3A is an enlarged, cross-sectional view of a pre-processed semiconductor substrate for the present invention microelectronic 3-dimensional solenoid.
Figure 3B:
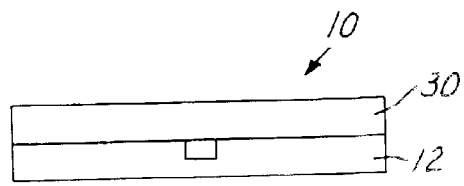
FIG. 3B is an enlarged, cross-sectional view of the pre-processed semiconductor substrate of FIG. 3A with a first sacrificial layer deposited on top.
Figure 3C:
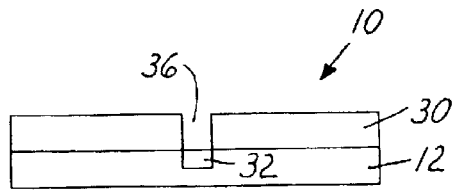
FIG. 3C is an enlarged, cross-sectional view of the present invention pre-processed semiconductor substrate of FIG. 3B with an opening etched through the sacrificial layer to expose the conductive pad.
Figure 3G:
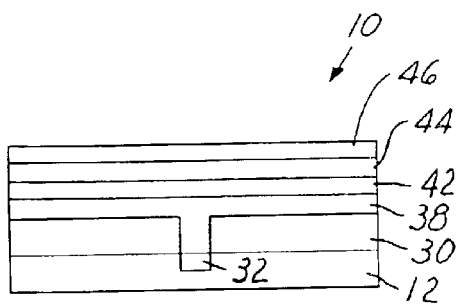
FIG. 3G is an enlarged, cross-sectional view of the present invention pre-processed semiconductor substrate of FIG. 3F with a third metal layer deposited on top by the second metal.
Figure 3D:
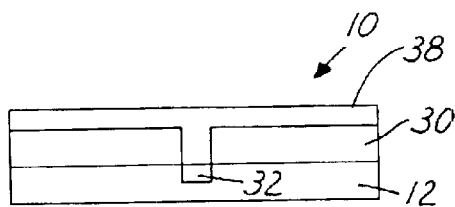
FIG. 3D is an enlarged, cross-sectional view of the present invention pre-processed semiconductor substrate with a first metal filling the opening and covering the top of the first sacrificial layer.

The present invention novel method is shown in FIGS. 3A~3J. In the first step of the process, as shown in FIG. 3A, a silicon substrate 12 which has a conductive pad 32 formed in a top surface 18 is provided. A first sacrificial layer 30 is then deposited of a material such as silicon oxide, silicon oxynitride or silicon nitride on top of the silicon substrate 12. The deposition process can be advantageously carried out by a chemical vapor deposition step. An opening 36 is then formed by a standard lithography technique to expose the conductive pad 32. This is shown in FIG. 3C. A first metal material is then deposited to fill the opening 36 and to cover the top of the first sacrificial layer 30. The first metal material may be suitably selected from the group consisting of Al, Cu and AlCu alloys. This is shown in FIG. 3D. Optionally, the top surface of the first metal layer 38 may be planarized by a technique such as chemical mechanical polishing before proceeding with the next step.

Figure 3H:
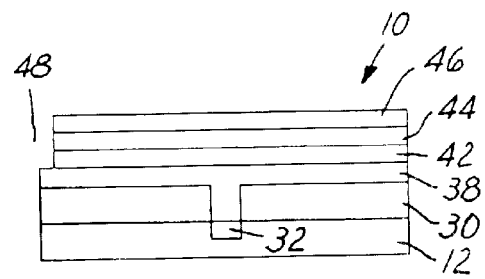
FIG. 3H is an enlarged, cross-sectional view of the present invention pre-processed semiconductor substrate of FIG. 3G with an opening patterned and etched at the edge of the substrate.
Figure 3E:
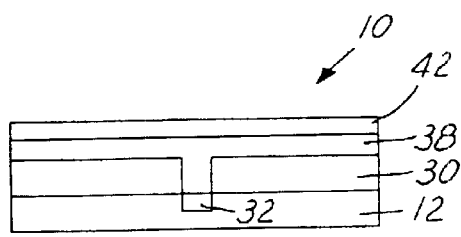
FIG. 3E is an enlarged, cross-sectional view of the present invention pre-processed semiconductor substrate of FIG. 3D with a second metal deposited on top forming a second metal layer.

A second metal layer 42 is then deposited on the first metal layer 38 by a second metal material such as Ni or Cr. Other suitable metal materials may also be used as long as the coefficient of thermal expansion of the second metal is smaller than the coefficient of thermal expansion of the first metal. On top of the second metal layer 42, is then deposited a second sacrificial layer 44, as shown in FIG. 3F. The second sacrificial layer 44 may be suitably deposited of the same material used in depositing the first sacrificial layer 30. For instance, a material such as silicon oxide, silicon oxynitride or silicon nitride. It should be noted that, a suitable thickness for the first metal layer 38 is between about 0.5 μm and about 2 μm, and preferably between about 0.8 μm and about 1.5 μm. A suitable thickness for the second metal layer 42 is between about 0.1 μm and about 0.5 μm, and preferably between about 0.15 μm and about 0.3 μm.

In the next step of the process, as shown in FIG. 3G, a third metal layer 46 is deposited of the same metal material used in depositing the second metal layer 42. For instance, the third metal layer 46 may be deposited of Ni or Cr to a similar thickness as the second metal layer 42. A standard photolithographic method is then used to form an opening 48 at one end of the present invention device 10 by etching away layers of 46,44 and 42. This is shown in FIG. 3H.

Figure 3I:
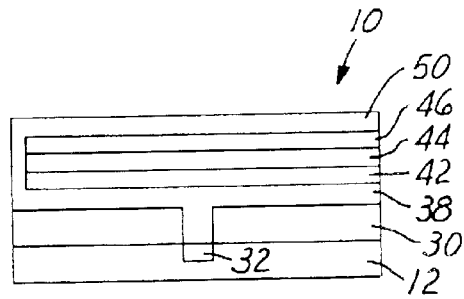
FIG. 3I is an enlarged, cross-sectional view of the present invention pre-processed semiconductor substrate of FIG. 3H with a fourth metal layer electroplated on top of the first metal.
Figure 3F:
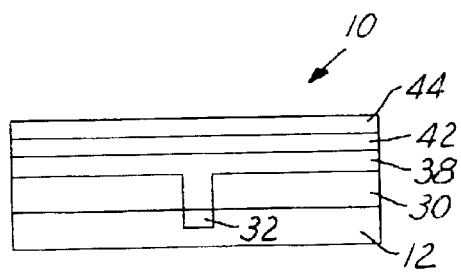
FIG. 3F is an enlarged, cross-sectional view of the present invention pre-processed semiconductor substrate with a second sacrificial layer deposited on top.
Figure 3J:
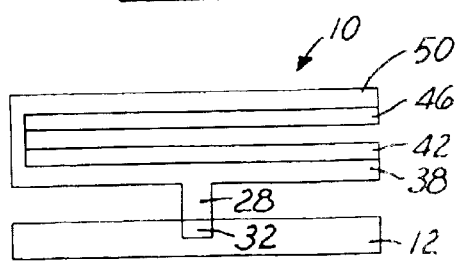
FIG. 3J is an enlarged, cross-sectional view of the present invention microelectronic 3-dimensional solenoid after the first and second sacrificial layer are etched away.

In the final two steps of the process, as shown in FIGS. 3I and 3J, a fourth metal layer 50 is first deposited by an electroplating technique to fill the opening 48 and to cover the top of the third metal layer 46. This is shown in FIG. 3I. The electroplating process can be suitably used for plating metals such as Al, Cu and AlCu alloys. The first sacrificial layer 30 and the second sacrificial layer 44 are then removed by an etching process, i.e., either wet etching or reactive ion dry etching, as shown in FIG. 3J. The removal of the sacrificial layers 30,44 enables the inductor coil 20 to expand into a substantially circular form or a substantially oval form, as that in FIG. 2B.

The present invention microelectronic 3-dimensional solenoid and method for fabricating the solenoid have therefore been amply described in the above description and in the appended drawings of FIGS. 1A~3J.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A microelectronic 3-dimensional solenoid comprising:
   a pre-processed semiconductor substrate;
   two supports upstanding from and spaced-apart on a top surface of said pre-processed semiconductor substrate, each support having a bottom end attached to said top surface of the substrate;
   an inductor coil having two spaced-apart ends each attached to one of two top ends of said two supports, said inductor coil being formed of a bi-layer metal laminate having an inner metal layer and an outer metal layer, said outer metal layer being formed of a first metal having a coefficient of thermal expansion larger than a coefficient of thermal expansion of a second metal that forms the inner metal layer.

2. A microelectronic 3-dimensional solenoid according to claim 1 further comprising conductive pads in said pre-processed semiconductor substrate for contacting said bottom ends of said supports.

3. A microelectronic 3-dimensional solenoid according to claim 1, wherein said outer metal layer having a thickness between about 0.5 m and about 2 m, said inner metal layer having a thickness between about 0.1 m and about 0.5 m.

4. A microelectronic 3-dimensional solenoid according to claim 1, wherein said first metal is selected from the group consisting of Al, Cu and AlCu alloys, said second metal is Ni or Cr.

5. A microelectronic 3-dimensional solenoid according to claim 1, wherein said two supports are formed of a metal selected from the group consisting of Al, Cu and AlCu alloys.

6. A microelectronic 3-dimensional solenoid according to claim 1, wherein said pre-processed semiconductor substrate is a silicon substrate.

7. A microelectronic 3-dimensional solenoid according to claim 1, wherein said two supports having a height sufficient to allow said inductor coil to be suspended over said pre-processed semiconductor substrate.

8. A microelectronic 3-dimensional solenoid according to claim 1, wherein said outer metal layer having a thickness of about 1 m and said inner metal layer having a thickness of about 0.2 m.

9. A microelectronic 3-dimensional solenoid according to claim 1, wherein said inductor coil having a substantially circular cross-section.

10. A microelectronic 3-dimensional solenoid according to claim 1, wherein said inductor coil having a substantially oval cross-section.

* * * * *